United States Patent
Nakaoka

(10) Patent No.: US 10,586,576 B2
(45) Date of Patent: Mar. 10, 2020

(54) MEMORY DEVICE

(71) Applicant: Winbond Electronics Corp., Taichung (TW)

(72) Inventor: Yuji Nakaoka, Kanagawa (JP)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 16/232,079

(22) Filed: Dec. 26, 2018

(65) Prior Publication Data

US 2019/0214066 A1 Jul. 11, 2019

(30) Foreign Application Priority Data

Jan. 5, 2018 (JP) .................................. 2018-000789

(51) Int. Cl.
| | |
|---|---|
| *G11C 8/10* | (2006.01) |
| *G11C 8/06* | (2006.01) |
| *G11C 5/02* | (2006.01) |
| *G11C 8/12* | (2006.01) |
| *G11C 11/408* | (2006.01) |

(Continued)

(52) U.S. Cl.
CPC .............. *G11C 8/10* (2013.01); *G11C 5/025* (2013.01); *G11C 5/066* (2013.01); *G11C 7/06* (2013.01); *G11C 8/06* (2013.01); *G11C 8/12* (2013.01); *G11C 11/4082* (2013.01); *G11C 11/4087* (2013.01); *G11C 11/4091* (2013.01)

(58) Field of Classification Search
CPC ....... G11C 11/4087; G11C 5/066; G11C 8/10; G11C 8/12
See application file for complete search history.

(56) References Cited

U.S. PATENT DOCUMENTS

| | | | | |
|---|---|---|---|---|
| 5,905,689 A | * | 5/1999 | Oh ........................... | G11C 8/10 365/230.06 |
| 6,304,509 B1 | * | 10/2001 | Hirobe ..................... | G11C 8/12 365/230.03 |

(Continued)

FOREIGN PATENT DOCUMENTS

| | | |
|---|---|---|
| CN | 100433194 | 11/2008 |
| TW | I237267 | 8/2005 |
| TW | I552163 | 10/2016 |

OTHER PUBLICATIONS

"Office Action of Taiwan Counterpart Application", dated Nov. 5, 2019, pp. 1-6.

*Primary Examiner* — Tuan T Nguyen
(74) *Attorney, Agent, or Firm* — JCIPRNET

(57) ABSTRACT

A memory device is provided. The memory device includes at least one memory bank, at least one first address decoder set, and at least one second address decoder set. Each of the at least one memory bank includes a plurality of memory cell arrays. Each of the at least one second address decoder set includes a plurality of second address decoders. The at least one second address decoder set receives a plurality of column select lines to perform an access operation on memory cells of the memory cell arrays. The column select lines are divided into a plurality of column select line groups, and each of the column select line groups is assigned to the second address decoder corresponding thereto, wherein the number of the column select lines allocated to each of the column select line groups is less than a total number of the column select lines.

12 Claims, 8 Drawing Sheets

(51) Int. Cl.
*G11C 5/06* (2006.01)
*G11C 7/06* (2006.01)
*G11C 11/4091* (2006.01)

(56) References Cited

U.S. PATENT DOCUMENTS

| | | |
|---|---|---|
| 7,515,501 B2* | 4/2009 | Bessho .................... G11C 7/18 365/230.03 |
| 9,711,224 B2 | 7/2017 | Tanzawa |
| 2008/0123461 A1 | 5/2008 | Kim et al. |
| 2011/0096584 A1 | 4/2011 | Nakaoka et al. |

* cited by examiner

MEMORY DEVICE

CROSS-REFERENCE TO RELATED APPLICATION

This application claims the priority benefit of Japan application serial no. 2018-000789, filed on Jan. 5, 2018. The entirety of the above-mentioned patent application is hereby incorporated by reference herein and made a part of this specification.

BACKGROUND

Technical Field

The disclosure relates to a memory technique, particularly relates to a memory device.

Related Art

Modern electronic devices are generally required to be capable of promptly processing a large amount of data, and the modern electronic devices are also desired to have a compact design. Hence, it is also expected that a semiconductor memory device used in the electronic devices can have a smaller volume with a large data capacity.

The semiconductor memory device may roughly be classified as a volatile memory device or a nonvolatile memory device according to operation properties thereof. Data stored in the volatile memory device are lost when no power is applied, while data stored in the nonvolatile memory device are retained even when power is no longer applied. While designing a circuit structure of the semiconductor memory device, address decoders are usually disposed around a memory cell array to reduce a chip size. If all the address decoders (e.g., X decoders and Y decoders) are disposed on the same side of the memory cell array, the chip size can be effectively reduced. However, numerous and complex wiring on the same side of the memory cell array could make it difficult to plan wiring for the circuit structure of the semiconductor memory device.

SUMMARY

The disclosure provides a memory device that moderately reduces the number of wires connected to address decoders (especially Y decoders) so as to reduce area occupied by logic circuits of the address decoders, thereby reducing design difficulty of the memory device.

The memory device according to the disclosure includes at least one memory bank, at least one first address decoder set and at least one second address decoder set. Each of the at least one memory bank includes a plurality of memory cell arrays. The at least one first address decoder set is coupled to the at least one memory bank. Each of the at least one first address decoder set includes a plurality of first address decoders. The at least one second address decoder set is coupled to the at least one memory bank. Each of the at least one second address decoder includes a plurality of second address decoders. The at least one second address decoder set receives a plurality of column select lines to perform an access operation on memory cells of the memory cell arrays. The column select lines are divided into a plurality of column select line groups, and each of the column select line groups is assigned to the second address decoder corresponding thereto, wherein the number of the column select lines allocated to each of the column select line groups is less than a total number of the column select lines.

To make the above features and advantages of the disclosure more comprehensible, examples accompanied with drawings are described in detail as follows.

DESCRIPTION OF THE EMBODIMENTS

Figure 1:
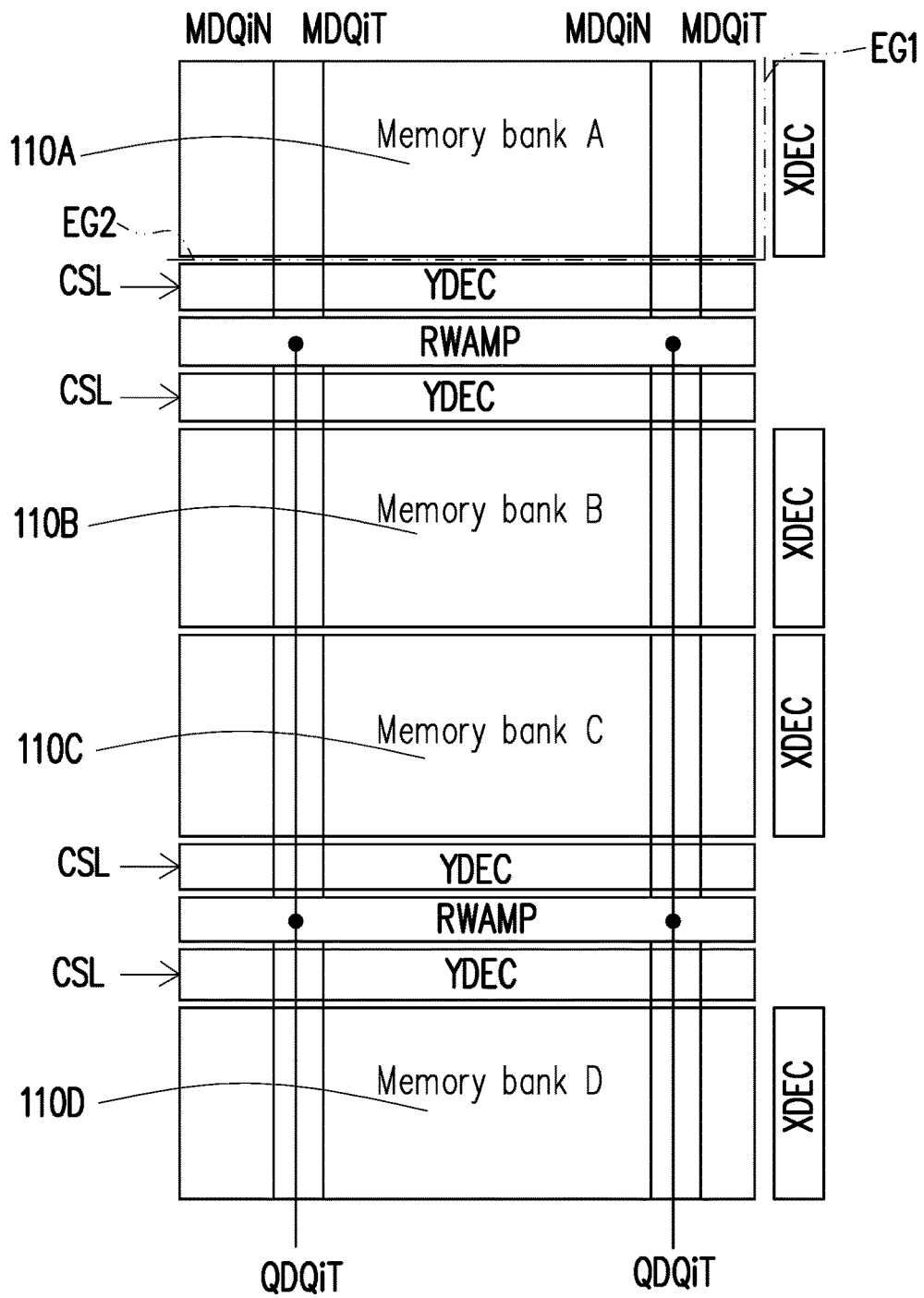
FIG. 1 is a block diagram of a memory device in accordance with an embodiment.
Figure 1:
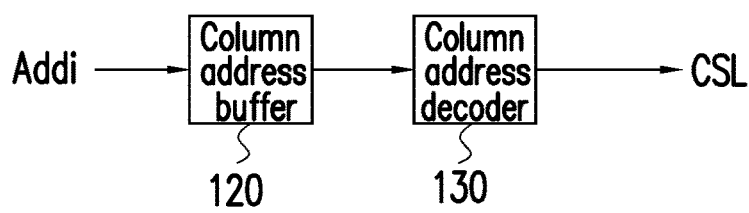
Figure 2:
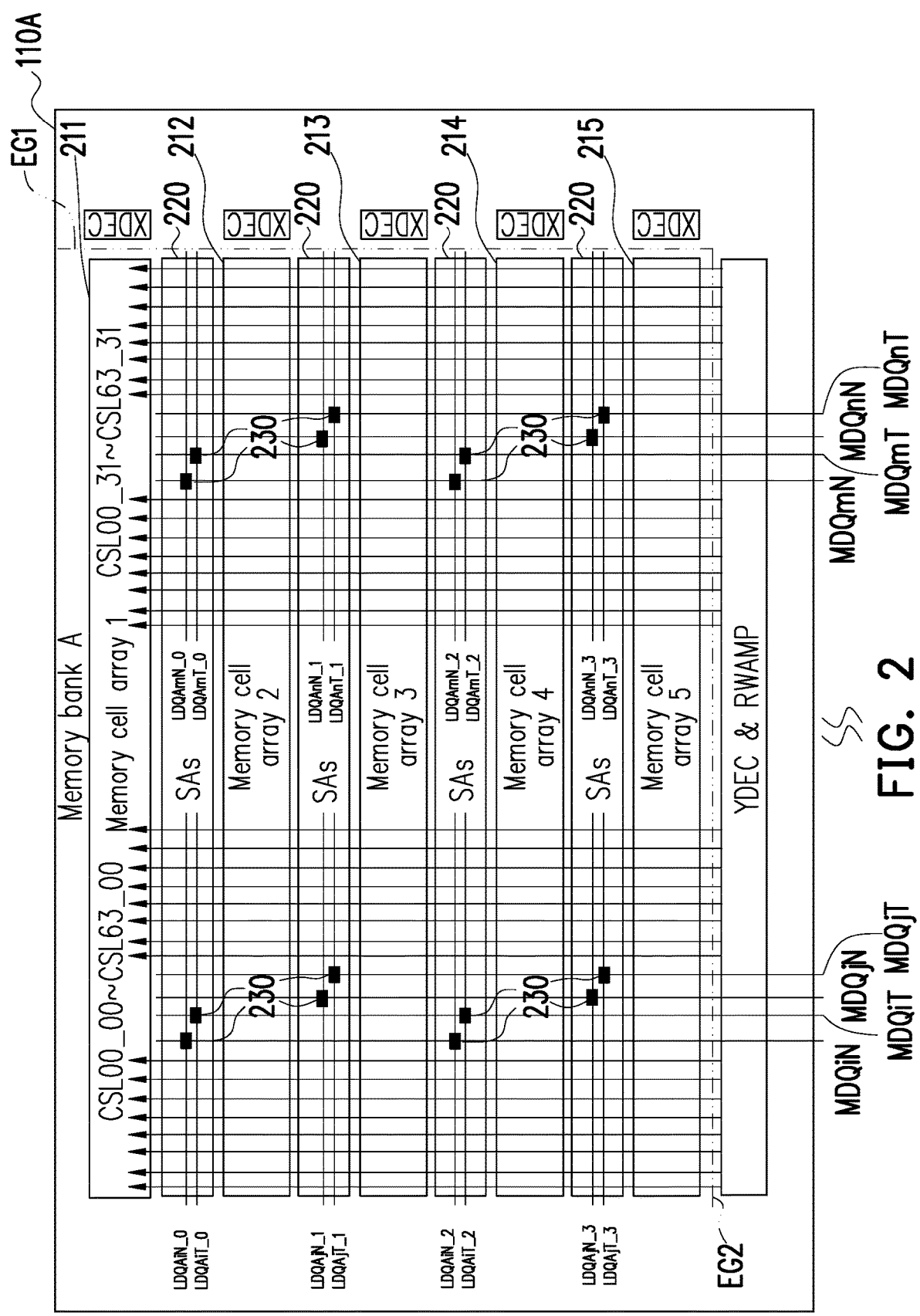
FIG. 2 illustrates a positional relationship between a memory bank A, a first address decoder XDEC and a second address decoder YDEC in FIG. 1 in accordance with an embodiment.

FIG. 1 is a block diagram of a memory device 100 in accordance with an embodiment. FIG. 2 illustrates a positional relationship between a memory bank A 110A, a first address decoder XDEC and a second address decoder YDEC in FIG. 1 in accordance with an embodiment. Depending on whether data is volatilized, the memory device 100 may be classified as a dynamic random access memory (DRAM), a synchronous dynamic random access memory (SDRAM), or a pseudo static random access memory (pseudo SRAM). Depending on memory cell elements in the memory, the memory device 100 may be classified as a NAND type flash memory or a resistive memory. Referring to FIG. 1 and FIG. 2 together, the memory device 100 includes at least one memory bank, at least one first address decoder set XDECs, and at least one second address decoder set YDECs. Each first address decoder set XDECs includes a plurality of first address decoders (also known as X-axis address decoders) XDEC. The first address decoder XDEC may also be referred to as a word line decoder. Each second address decoder set YDECs includes a plurality of second address decoders (also known as Y-axis address decoders) YDEC. The second address decoder YDEC may also be referred to as a column select line decoder. In the present embodiment, four memory banks (the memory bank A 110A, a memory bank B 110B, a memory bank C 110C, and a memory bank D 110D) are taken as examples of the above-mentioned memory bank. The memory device 100 further includes a plurality of read/write amplifiers RWAMP for amplifying a data signal. The read/write amplifiers RWAMP are disposed between the memory bank A 110A and the memory bank B 110B and between the memory bank C 110C and the memory bank D 110D. The read/write amplifier RWAMP strengthens a signal in a global data signal line to avoid signal attenuation. The first address decoder XDEC is disposed along a first edge EG1 of the memory bank A 110A, and the second address decoder YDEC is disposed along a second edge EG2 of the memory bank A 110A. The first edge EG1 that the first address decoder XDEC is disposed close to is different from the second edge EG2 that the second address decoder YDEC is disposed close to. In other words, the first address decoder XDEC is disposed vertically relative to the memory bank, and the second address decoder YDEC is disposed horizontally relative to the memory bank.

FIG. 2 illustrates a detailed structure of the memory bank A 110A in FIG. 1. The memory bank A 110A includes a memory cell array 1 211 to a memory cell array 5 215. The memory bank A 110A further includes a plurality of sense amplifier sets SAs 220. Each sense amplifier set SAs 220 is disposed between two memory cell arrays. For example, the sense amplifier set SAs 220 is disposed between a memory cell array 211 and a memory cell array 212, between the memory cell array 212 and a memory cell array 213, between the memory cell array 213 and a memory cell array 214, and between the memory cell array 214 and a memory cell array 215. Each sense amplifier set SAs 220 includes a plurality of sense amplifiers. The number of the sense amplifiers depends on the number of memory cells in the memory cell array.

The memory device 100 in FIG. 1 further includes a column address buffer 120 and a column address decoder 130. The column address buffer 120 obtains a memory address signal Addi from the outside device (e.g., an electronic device in which the memory device 100 is installed), and temporarily stores the memory address signal Addi. The column address decoder 130 decodes the memory address signal Addi and converts it into column select signals, and provides the column select signals to a column select line CSL. In the present embodiment, the column select line CSL in FIG. 1 may represent column select lines CSL00_00 to CSL63_00 and CSL00_31 to CSL63_31 in FIG. 2. The column select line CSL of the present embodiment is composed of 64 data lines. The memory bank A 110A in FIG. 2 further includes a plurality of data switching circuits 230. The second address decoder YDEC in FIG. 2 performs an access operation on different memory cell arrays respectively through two sets of column select lines (CSL00_00 to CSL63_00 and CSL00_31 to CSL63_31). In detail, the memory cell arrays 212 to 215 may each be divided into a plurality of blocks according to extension directions of the column select lines CSL00_00 to CSL63_00 and CSL00_31 to CSL63_31, and the access operation on the memory cells is partially performed according to the blocks and the data switching circuit 230. The second address decoder YDEC receives the column select lines CSL00_00 to CSL63_00 and CSL00_31 to CSL63_31 to select corresponding memory cell blocks, and performs a write operation or a read operation on the selected memory cell blocks, so as to access the memory cells via a local data signal line, a global data signal line, a global data quality signal line, and the data switching circuit 230.

In the present embodiment, the local data signal line includes LDQAiN_0, LDQAjN_1, LDQAiN_2, LDQAjN_3, LDQAmN_0, LDQAnN_1, LDQAmN_2, LDQAnN_3, LDQAiT_0, LDQAjT_1, LDQAiT_2, LDQAjT_3, LDQAmT_0, LDQAnT_1, LDQAmT_2 and LDQAnT_3; the global data signal line includes MDQiN, MDQiT, MDQjN, MDQjT, MDQmN, MDQmT, MDQnN and MDQnT; the global data quality signal line includes QDQiT, wherein i, j, m and n may be positive integers, i may be one of 0 to 3, j may be one of 4 to 7, m may be one of 120 to 123, and n may be one of 124 to 127. That is to say, i, j, m and n may be four different numbers so that the sense amplifier set SAs may have four cases.

The second address decoder YDEC in both FIG. 1 and FIG. 2 is disposed between the memory banks. For example, the second address decoder YDEC is disposed between the memory bank A 110A and the memory bank B 110B and between the memory bank C 110C and the memory bank D 110D. In the case where the memory device 100 has a larger data capacity, the circuit structure in FIG. 1 may fully function. However, in the case where the memory device 100 has a smaller data capacity, when there are numerous second address decoders YDEC and read/write amplifiers RWAMP, a chip in the memory device 100 is accordingly increased in size, thus causing problems. To solve this, the first address decoder XDEC and the second address decoder YDEC may be disposed on the same side (e.g., the first edge EG1) of the memory bank as shown in FIG. 3.

Figure 3:
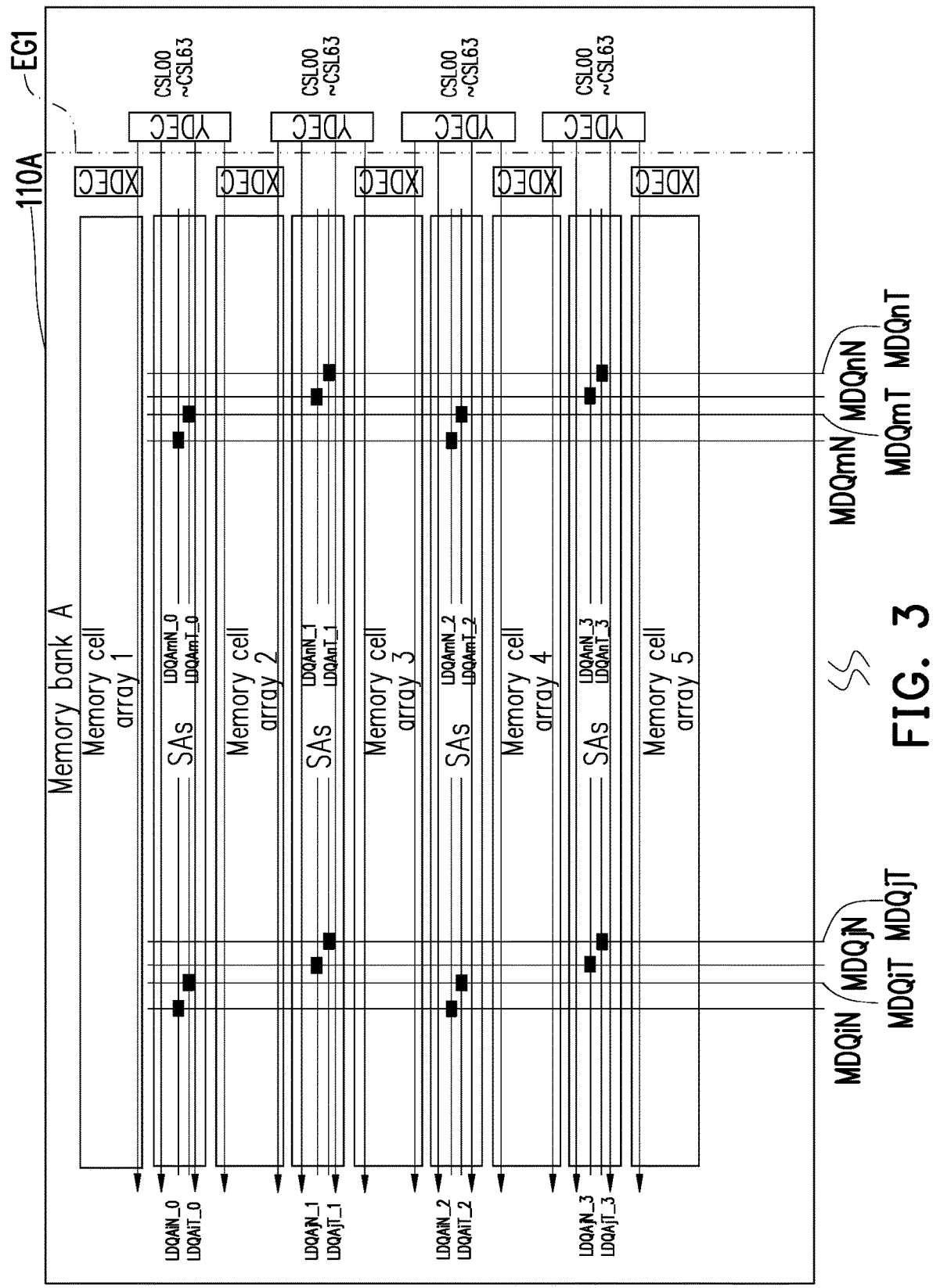
FIG. 3 illustrates a positional relationship between the memory bank A, the first address decoder XDEC and the second address decoder YDEC in FIG. 1 in accordance with another embodiment.

FIG. 3 illustrates a positional relationship between the memory bank A, the first address decoder XDEC and the second address decoder YDEC in FIG. 1 in accordance with another embodiment. FIG. 3 mainly differs from FIG. 2 in that the second address decoder YDEC is disposed close to the first edge EG1 of the memory bank A 110A and is closer to where the first address decoder XDEC is disposed. In other words, both the first address decoder XDEC and the second address decoder YDEC may be implemented by being disposed vertically.

In the present embodiment, each sense amplifier set SAs in FIG. 3 is disposed corresponding to each second address decoder YDEC, and each second address decoder YDEC is coupled to all the column select lines CSL (e.g., the column select lines CSL00 to CSL63). The sense amplifier set SAs of the present embodiment has four cases, all of which require the second address decoder YDEC for control. Accordingly, wiring at the first edge EG1 of the memory bank A 110A becomes very numerous and complex. That is to say, in addition to the wiring structure of the first address decoder XDEC that originally exists, it is necessary to provide a wiring structure of the second address decoder YDEC for the column select lines CSL at the first edge EG1. The wiring cannot be disposed on the other sides of the memory bank A 110A in FIG. 3, thus increasing design difficulty with respect to the memory device.

Since the sense amplifier set SAs requires the second address decoder YDEC for control, and actually not all the 64 column select lines CSL are needed for address selection for the memory cell array corresponding to the second address decoder YDEC, in the embodiment of the disclosure, according to the number (e.g., four) of cases of the sense amplifier set SAs, the 64 column select lines CSL are divided into four column select line groups CSLG1 to CSLG4. Each column select line group only has 16 column select lines CSL, and the column select line groups CSLG1 to CSLG4 are respectively assigned to four second address decoders YDEC. In this way, the wires to be coupled to each second address decoder YDEC is reduced from 64 column select lines to 16 column select lines, and wiring area of a logic circuit inside the second address decoder YDEC can therefore be saved. In another respect, the wiring difficulty in disposing the first address decoder XDEC and the second address decoder YDEC on the same side of the memory bank can be reduced. A detailed implementation manner is described in the following embodiments in accordance with the disclosure.

Figure 4:
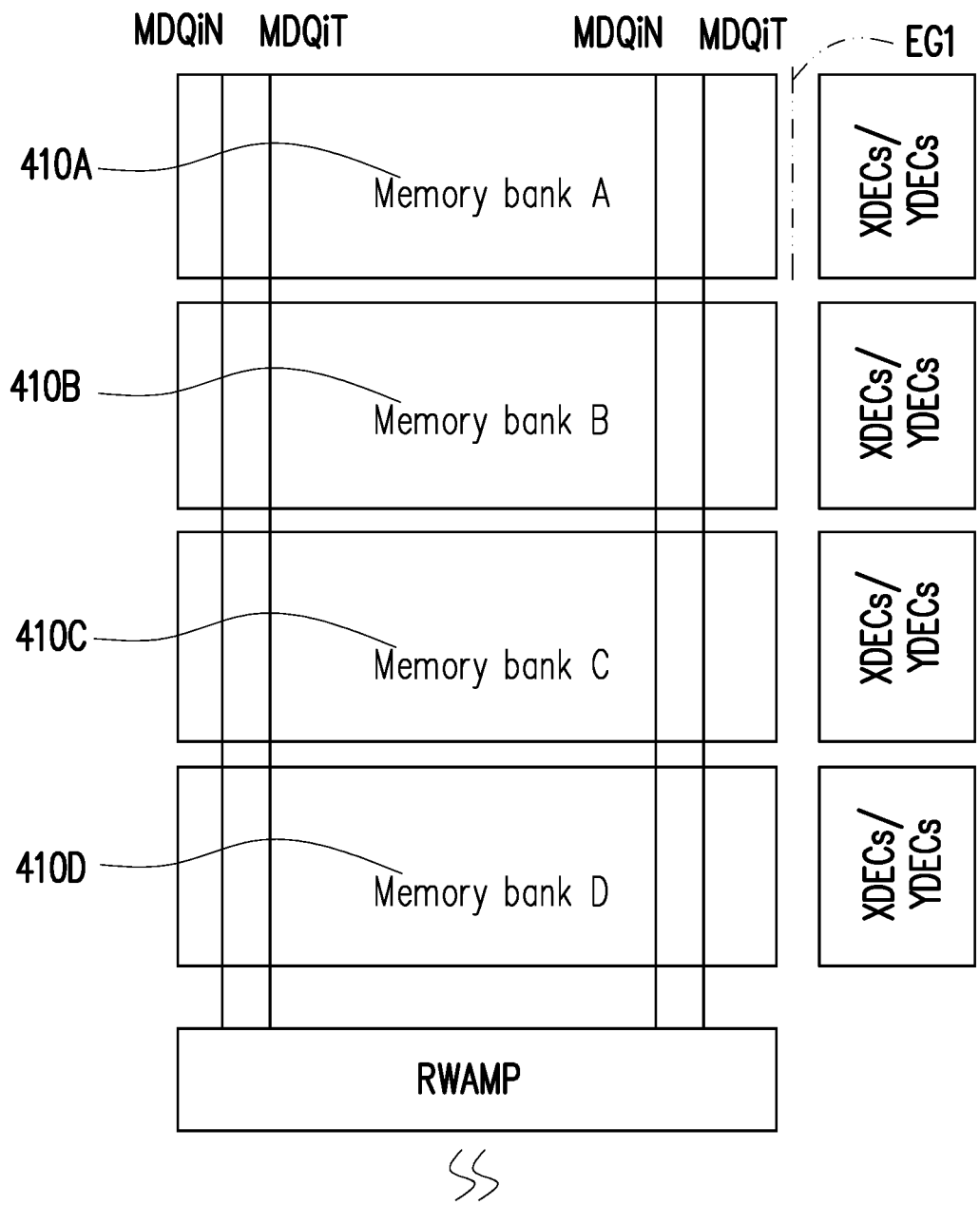
FIG. 4 is a block diagram of a memory device in accordance with a first embodiment of the disclosure.
Figure 5:
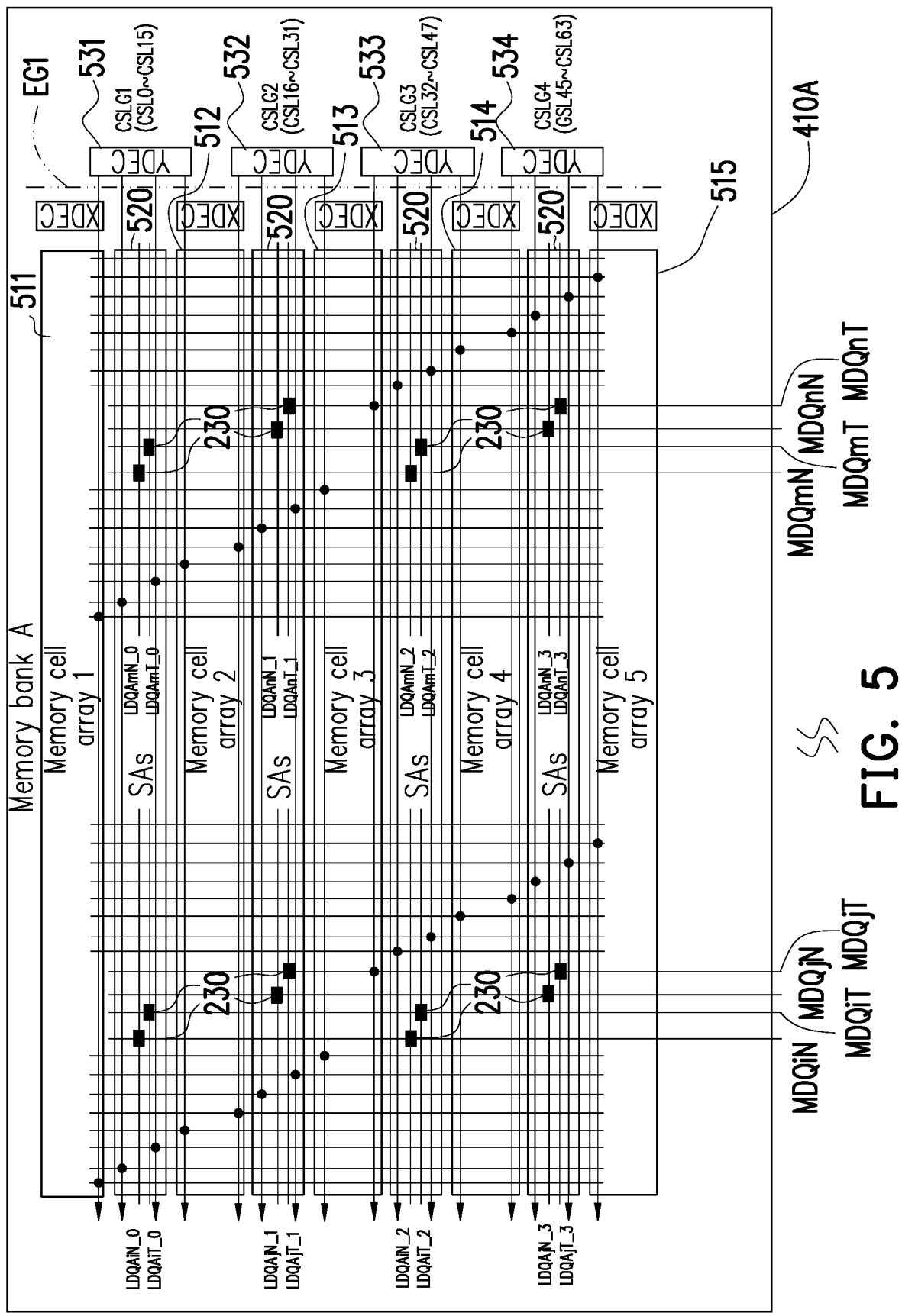
FIG. 5 illustrates a positional relationship between the memory bank A, the first address decoder XDEC and the second address decoder YDEC in FIG. 4.

FIG. 4 is a block diagram of a memory device 400 in accordance with a first embodiment of the disclosure. FIG. 5 illustrates a positional relationship between a memory bank A 410A, the first address decoder XDEC and the second address decoder YDEC in FIG. 4. The memory device 400 includes a plurality of memory banks (e.g., the memory bank A 410A, a memory bank B 410B, a memory bank C 410C, and a memory bank D 410D), a plurality of first address decoder sets XDECs, and a plurality of second address decoder sets YDECs. The memory bank A 410A in FIG. 5 includes a memory cell array 1 511 to a memory cell array 5 515. In the embodiment of the disclosure, the memory banks 410A to 410D are disposed vertically, and a plurality of first address decoders XDEC in the first address decoder set XDECs and a plurality of second address decoders YDEC in the second address decoder set YDECs are also disposed vertically. In other words, in FIG. 5, both the first address decoders XDEC and the second address decoders YDEC corresponding to the memory bank A 410A are disposed along the first edge EG1. The memory device 400 further includes a plurality of sense amplifier sets SAs 520 between the memory cell arrays. Each sense amplifier set SAs 520 is disposed between two adjacent memory cell arrays. The read/write amplifier RWAMP, the first address decoder set XDECs, and the memory banks 410A to 410D in FIG. 4 have the same functions and circuit structures as the read/write amplifier RWAMP, the first address decoder set XDECs, and the memory banks 110A to 110D in FIG. 2 and FIG. 3.

FIG. 5 in accordance with the embodiment of the disclosure significantly differs from FIG. 3 in that, according to the number of cases of the sense amplifier set SAs (each sense amplifier set SAs of the present embodiment has four cases), the column select lines CSL0 to CSL63 are divided evenly into four column select line groups CSLG1 to CSLG4. Each of the column select line groups CSLG1 to CSLG4 is assigned to the second address decoder YDEC corresponding to the sense amplifier set SAs. In other words, the column select line group CSLG1 includes the column select lines CSL0 to CSL15, the column select line group CSLG2 includes the column select lines CSL16 to CSL31, the column select line group CSLG3 includes the column select lines CSL32 to CSL47, and the column select line group CSLG4 includes the column select lines CSL48 to CSL63. A first second address decoder YDEC 531 is coupled to the column select line group CSLG1, a second second address decoder YDEC 532 is coupled to the column select line group CSLG2, a third second address decoder YDEC 533 is coupled to the column select line group CSLG3, and a fourth second address decoder YDEC 534 is coupled to the column select line group CSLG4.

In this way, since the number of column select lines coupled to the second address decoders YDEC is reduced, the area occupied by the logic circuits in the second address decoders YDEC is accordingly reduced. For example, a ratio of the area used by the logic circuit in the second address decoder YDEC coupled to the 64 column select lines CSL00 to CSL63 in FIG. 3 to the area used by the logic circuit in the second address decoder YDEC coupled to the 16 column select lines in FIG. 5 should approximate to 4:1. In addition, since each second address decoder YDEC is coupled to a different column select line group CSLG1 to CSLG4, signal loss suffered by the column select lines is reduced. Therefore, in FIG. 4, there is no need to provide as many read/write amplifiers RWAMP as there are in FIG. 1, and a single read/write amplifier RWAMP may be disposed to be shared by the memory banks. Moreover, since only a single read/write amplifier RWAMP is needed, the global data signal lines in the memory device 400 shown in FIG. 4 and FIG. 5 do not require an additional global data quality signal line (e.g., QDQiT shown in FIG. 1) for controlling and sharing the read/write amplifier RWAMP. In this way, in the case where the memory device 400 has a smaller data capacity, the embodiment of the disclosure can reduce the size of the chip, thereby saving costs.

Figure 6:
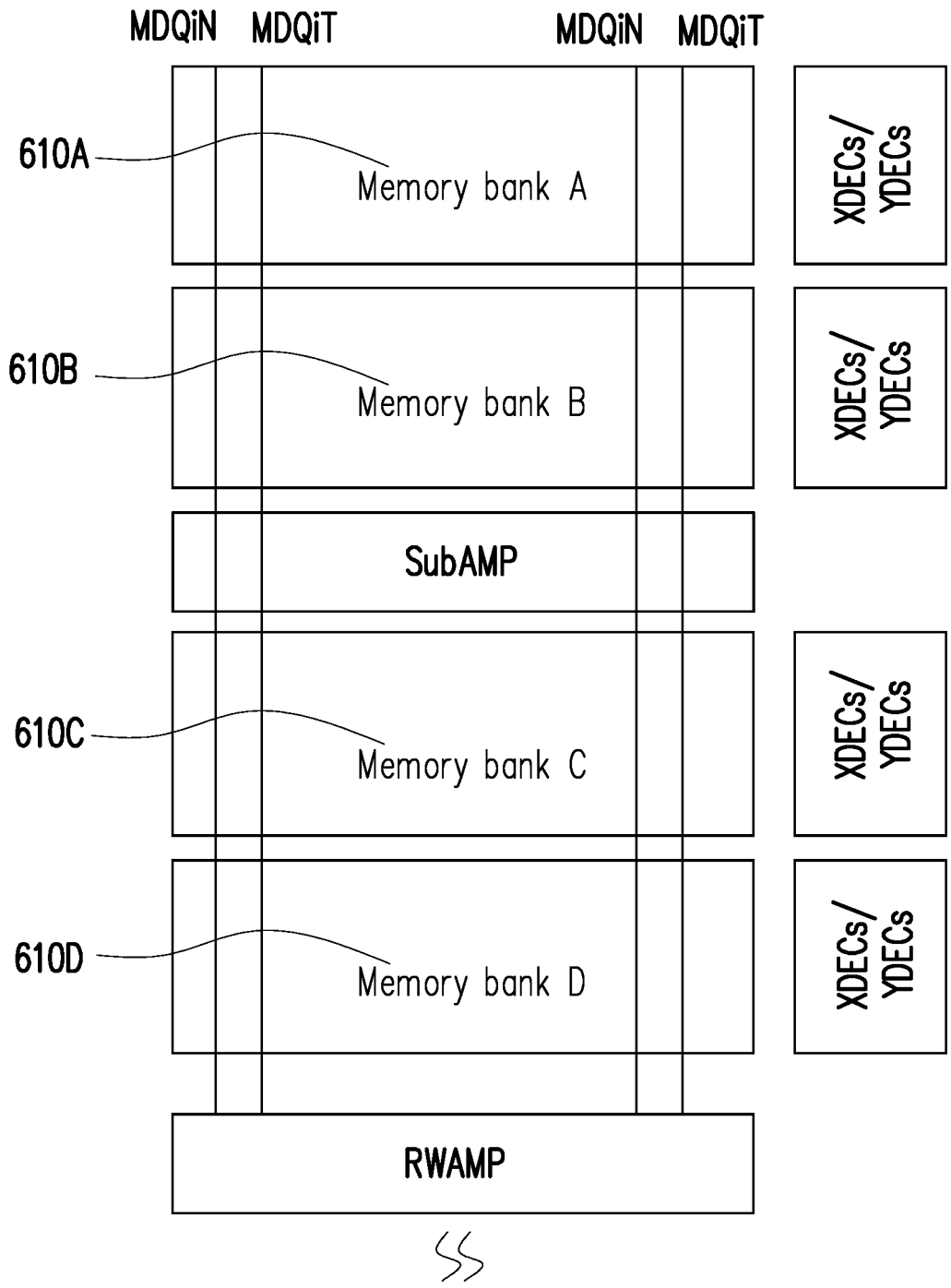
FIG. 6 is a block diagram of a memory device in accordance with a second embodiment of the disclosure.

FIG. 6 is a block diagram of a memory device 600 in accordance with a second embodiment of the disclosure. FIG. 6 is similar to FIG. 4 but mainly differs therefrom in that when the global data signal lines (e.g., MDQiN and MDQiT in FIG. 6) are too long due to a larger number of memory banks 610A to 610D, a sub data amplifier SubAMP may be disposed to boost signals in the global data signal lines MDQiN and MDQiT to avoid signal attenuation. The elements (e.g., the memory bank A 610A to the memory bank D 610D, the first address decoder set XDECs, and the read/write amplifier RWAMP) in FIG. 6 have the same functions and circuit structures as those having the same names in FIG. 4.

Figure 7:
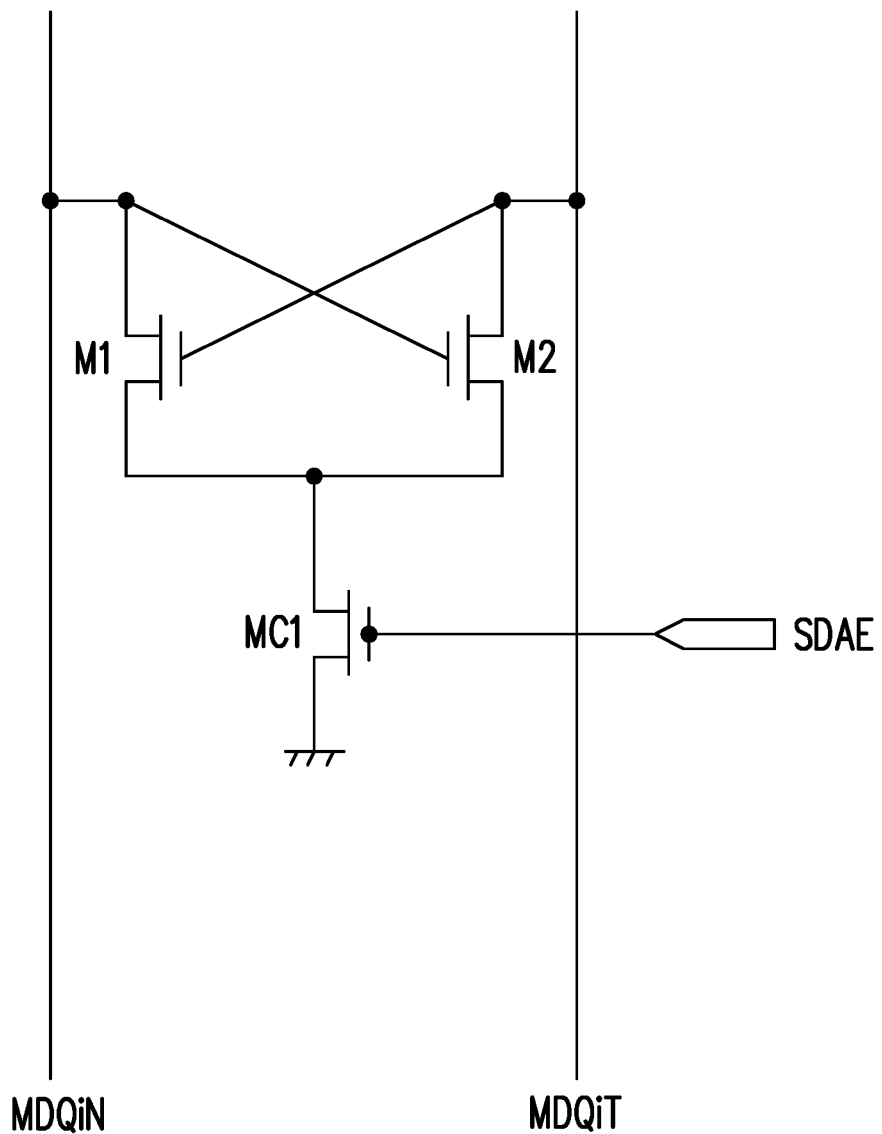
FIG. 7 is a circuit diagram of a sub data amplifier SubAMP in FIG. 6.

FIG. 7 is a circuit diagram of the sub data amplifier SubAMP 650 in FIG. 6. The sub data amplifier SubAMP 650 includes a first transistor M1, a second transistor M2 and a control transistor MC1. A first terminal (drain terminal) of the first transistor M1 is coupled to the global data signal line MDQiN and a control terminal (gate terminal) of the second transistor M2. A first terminal (drain terminal) of the second transistor M2 is coupled to the global data signal line MDQiT and a control terminal (gate terminal) of the first transistor M1. A second terminal (source terminal) of the first transistor M1 and a second terminal (source terminal) of the second transistor M2 are both coupled to a first terminal (drain terminal) of the control transistor MC1. A second terminal (source terminal) of the control transistor MC1 receives a first voltage (e.g., receives a ground voltage), and a control terminal (gate terminal) of the control transistor MC1 receives an activate signal SDAE of the sub data amplifier SubAMP 650. Therefore, when the activate signal SDAE is enabled, the global data signal lines MDQiN and MDQiT can be amplified through the first transistor M1 and the second transistor M2.

Figure 8:
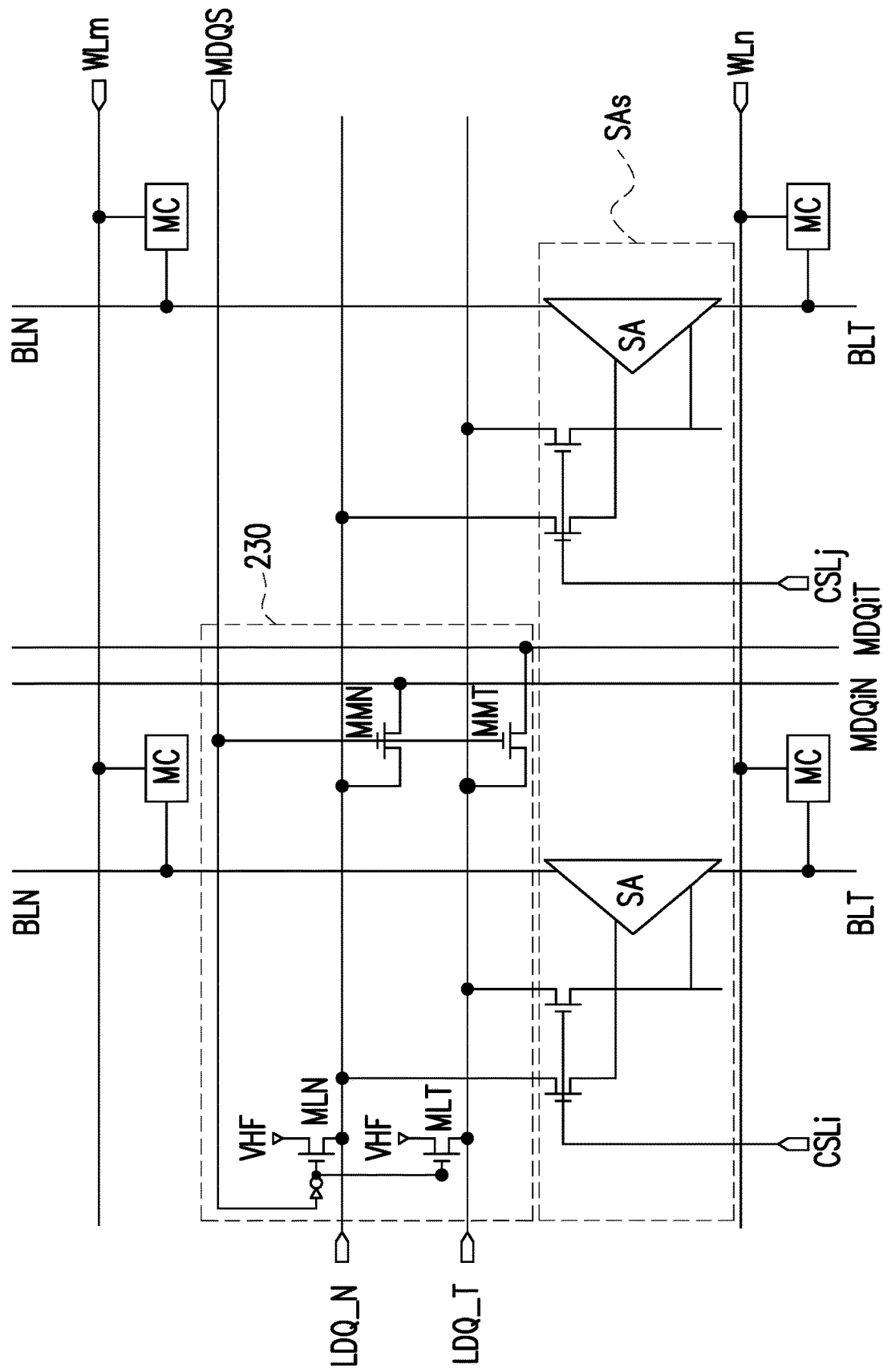
FIG. 8 is a circuit diagram of a data switching circuit and peripheral circuits.

FIG. 8 is a circuit diagram of the data switching circuit 230 and peripheral circuits. The data switching circuit 230 mainly accesses data in memory cells by switching between the local data signal line and the global data signal line. The circuit in FIG. 8 mainly includes a plurality of memory cells MC, a sense amplifier SA and the data switching circuit 230. The memory cells MC exist at intersections of bit lines BLN, BLT and word lines WLn, WLm. The sense amplifier SA transmits data in the memory cells MC to local data signal lines LDQ_N and LDQ_T through column select lines CSLi and CSLj, respectively, strengthening signals in the local data signal lines LDQ_N and LDQ_T. The data switching circuit 230 mainly includes a first set of transistors MLN and MLT, and a second set of transistors MMN and MMT. When a switching signal MDQS is disabled (logic low), the first set of transistors MLN and MLT is turned on so that the signals in the local data signal lines LDQ_N and LDQ_T are equal to a preset voltage VHF. When the switching signal MDQS is enabled (logic high) and signals in the column select lines CSLi and CSLj are enabled (logic high), the sense amplifier SA transmits the data in the memory cells MC to the local data signal lines LDQ_N and LDQ_T. Since the second set of transistors MMN and MMT is turned on, the data in the local data signal lines LDQ_N and LDQ_T are transmitted to the global data signal lines MDQiN and MDQiT. Thereby, the data in the memory cells MC are transmitted to the global data signal lines MDQiN and MDQiT.

In summary, in the memory device according to the embodiment of the disclosure, according to the number (e.g., four) of cases of the sense amplifier set SAs, the 64 column select lines CSL are divided into four column select line groups, wherein each column select line group has 16 column select lines, and the column select line groups are respectively assigned to four second address decoders YDEC. In this way, the wires to be coupled to each second address decoder YDEC is reduced from 64 column select lines to 16 column select lines, and the wiring area of the logic circuit inside the second address decoder YDEC can therefore be saved. In another respect, the wiring difficulty in disposing the first address decoder XDEC and the second address decoder YDEC on the same side of the memory bank can be reduced.

Although the disclosure has been described with reference to the above examples, it will be apparent to one of ordinary skill in the art that modifications to the described examples may be made without departing from the spirit of the disclosure. Accordingly, the scope of the disclosure will be defined by the attached claims and not by the above detailed descriptions.

What is claimed is:

1. A memory device, comprising:
   at least one memory bank, each of the at least one memory bank comprising a plurality of memory cell arrays;
   at least one first address decoder set coupled to the at least one memory bank, each of the at least one first address decoder set comprising a plurality of first address decoders; and
   at least one second address decoder set coupled to the at least one memory bank, each of the at least one second address decoder set comprising a plurality of second address decoders, wherein the at least one second address decoder set receives a plurality of column select lines to perform an access operation on memory cells in the memory cell arrays,
   wherein the column select lines are divided into a plurality of column select line groups, and each of the column select line groups is assigned to the second address decoder corresponding thereto, wherein number of the column select lines allocated to each of the column select line groups is less than a total number of the column select lines.

2. The memory device of claim 1, wherein the plurality of first address decoders and the plurality of second address decoders are disposed on a same side of the at least one memory bank.

3. The memory device of claim 1, wherein the number of the column select lines allocated to each of the column select line groups is equal to that obtained by dividing the total number of the column select lines by a total number of the column select line groups.

4. The memory device of claim 3, wherein the total number of the column select lines is 64, the total number of the column select line groups is 4, and the number of the column select lines allocated to each of the column select line groups is 16.

5. The memory device of claim 1, further comprising:
   a plurality of sense amplifier sets each disposed between adjacent memory cell arrays,
   wherein a total number of the sense amplifier sets is equal to a total number of the at least one second address decoder set, and
   the number of the column select lines allocated to each of the column select line groups is equal to that obtained by dividing the total number of the column select lines by the total number of the sense amplifier sets.

6. The memory device of claim 5, wherein the total number of the sense amplifier sets is 4, and number of the memory cell arrays in each of the at least one memory bank is 5.

7. The memory device of claim 1, wherein the first address decoders are word line decoders, and the second address decoders are column select line decoders.

8. The memory device of claim 1, further comprising:
   a read/write amplifier coupled to a global data signal line of the at least one memory bank, wherein the at least one memory bank shares the read/write amplifier.

9. The memory device of claim 1, further comprising:
   a column address buffer configured to obtain a memory address signal from an external device and temporarily store the memory address signal; and
   a column address decoder coupled to the column address buffer and configured to decode the memory address signal to convert it into a column select signal, and to provide the column select signal to the column select lines.

10. The memory device of claim 8, further comprising:
    a sub data amplifier configured to boost a signal in the global data signal line.

11. The memory device of claim 10, wherein the sub data amplifier comprises:
    a first transistor, whose first terminal is coupled to the global data signal line;
    a second transistor, whose first terminal is coupled to the global data signal line and a control terminal of the first transistor, and whose control terminal is coupled to the global data signal line and the first terminal of the first transistor; and
    a control transistor, whose first terminal is coupled to a second terminal of the first transistor and a second terminal of the second transistor, whose second terminal receives a first voltage, and whose control terminal receives an activate signal of the sub data amplifier.

12. The memory device of claim 1, wherein the memory cell arrays are divided into a plurality of blocks according to an extension direction of the column select lines, and the memory device further comprises:
    a data switching circuit, partially performing the access operation on the memory cells according to the blocks, a switching signal, and the column select lines, wherein the data switching circuit comprises:
    a first set of transistors, whose first terminal is coupled to a local data signal line and whose control terminal receives the switching signal; and
    a second set of transistors, whose first terminal is coupled to the local data signal line, whose second terminal is coupled to a global data signal line, and whose control terminal receives the switching signal,
    wherein, when the switching signal is disabled, the first set of transistors is turned on to make a signal in the local data signal line equal to a preset voltage, and when the switching signal is enabled and a signal in the column select lines is enabled, the second set of transistors is turned on to pass data in the local data signal line to the global data signal line.

* * * * *